United States Patent
Greer et al.

(10) Patent No.: US 7,545,007 B2
(45) Date of Patent: Jun. 9, 2009

(54) MOS VARACTOR WITH SEGMENTED GATE DOPING

(75) Inventors: Heidi L. Greer, Essex Junction, VT (US); Seong-Dong Kim, Williston, VT (US); Robert M. Rassel, Colchester, VT (US); Kunal Vaed, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 11/161,533

(22) Filed: Aug. 8, 2005

(65) Prior Publication Data
US 2007/0029587 A1 Feb. 8, 2007

(51) Int. Cl.
*H01L 29/76* (2006.01)
(52) U.S. Cl. ............... 257/386; 257/E27.049; 257/E29.344
(58) Field of Classification Search .......... 257/382, 257/386, E27.049, E29.344
See application file for complete search history.

(56) References Cited

U.S. PATENT DOCUMENTS

| | | | |
|---|---|---|---|
| 4,745,079 A * | 5/1988 | Pfiester | 438/306 |
| 5,079,177 A | 1/1992 | Lage | |
| 5,204,990 A * | 4/1993 | Blake et al. | 257/300 |
| 5,210,435 A | 5/1993 | Roth | |
| 5,593,909 A | 1/1997 | Han | |
| 5,643,820 A * | 7/1997 | Williams et al. | 438/394 |
| 5,756,365 A * | 5/1998 | Kakumu | 438/304 |
| 5,894,157 A | 4/1999 | Han | |
| 5,977,591 A | 11/1999 | Fratin | |
| 6,097,070 A | 8/2000 | Mandelman | |
| 6,281,559 B1 | 8/2001 | Yu | |
| 6,300,177 B1 | 10/2001 | Sundaresan | |
| 6,407,412 B1 | 6/2002 | Iniewski | |
| 6,492,688 B1 | 12/2002 | Ilg | |
| 6,586,808 B1 | 7/2003 | Xiang | |
| 6,630,720 B1 | 10/2003 | Maszara | |
| 6,667,539 B2 | 12/2003 | Adler | |
| 2002/0074589 A1* | 6/2002 | Benaissa et al. | 257/312 |
| 2003/0137796 A1* | 7/2003 | Bulucea | 361/277 |
| 2003/0178689 A1 | 9/2003 | Maszara | |
| 2004/0252546 A1* | 12/2004 | Liaw | 365/154 |
| 2005/0161743 A1* | 7/2005 | Voldman | 257/360 |

* cited by examiner

*Primary Examiner*—Thomas L Dickey
(74) *Attorney, Agent, or Firm*—Anthony J. Canale

(57) ABSTRACT

A MOS varactor is formed having a gate electrode comprising at least two abutting oppositely doped regions shorted together, in which the two regions are implanted simultaneously with source/drain implants for first and second types of transistor; at least one contact to a lower electrode is also formed simultaneously with the source/drain implants for the first type of transistor; the varactor insulator is formed simultaneously with the gate insulator for one type of transistor; and the lower electrode is formed simultaneously with a well for the first type of transistor, so that no additional mask is required.

9 Claims, 3 Drawing Sheets

MOS VARACTOR WITH SEGMENTED GATE DOPING

TECHNICAL FIELD

The field of the invention is that of the fabrication of variable capacitors using integrated circuit techniques.

BACKGROUND OF THE INVENTION

Currently, the present MOS varactors have a limited tuning range which may also overlap positive and negative biases in order to encompass a complete tuning range as required by the circuit they are used in.

Past implementations to improve the tuneability of a varactor have utilized separate n and p type gates wired in parallel. This approach increases the total required area and therefore is not an optimum solution.

U.S. Pat. No. 6,667,539, to E. Alder, provides for a MOS varactor circuit having a pair of serially-connected varactors whose junctions are connected via a tap of a resistor to a resistor which is connected to adjacent terminals.

Solutions that provide for MOS varactors with improved tuneability without impacting area, are of great value.

SUMMARY OF THE INVENTION

The invention relates to a structure and method of fabrication of a MOS varactor whereby abutted p-n junctions in the polysilicon gate allow for complete elimination of metal wiring; hence, providing for enhanced tuneability without impacting the area requirement.

A feature of the invention is the use of the same implants to form the varactor as are used in standard circuit elements, thereby eliminating the need for one or more additional masks.

Another feature of the invention is that the voltage range over which the varactor may be tuned is increased without increasing the area of the varactor.

DETAILED DESCRIPTION

Figure 1:
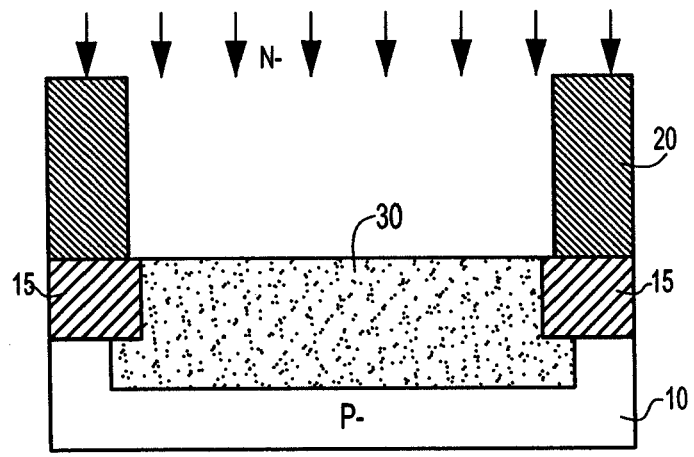
FIG. 1 shows the formation of a well to hold the device.

FIG. 1 shows a preliminary step in forming a varactor, in which a p-silicon substrate 10 is implanted with an N-well 30, using the same N⁻ implant dose that is used elsewhere in the circuit to form N-wells. For convenience in the appended claims, the phrase "using the process dose for _X_" will be used to indicate that the element of the varactor in question uses the same dose, energy, etc as the referenced element in other circuit components, where the X denotes a well, a source or drain and the like. Photoresist 20 has been formed with an aperture exposing the area that will hold the varactor, overlapping with isolation 15, illustratively the same oxide shallow trench isolation as is used to isolate transistors. Well 30 will form the lower electrode of the varactor.

Figure 2:
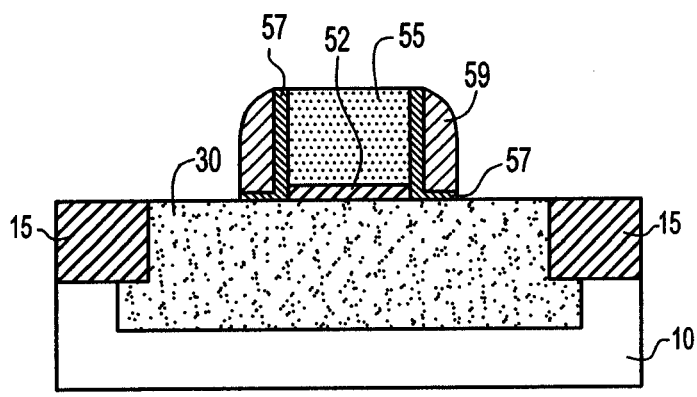
FIG. 2 shows a structure similar to a MOS transistor.

FIG. 2 shows the same area after a series of standard steps that include growing thermal oxide 52 simultaneously with the growth of gate oxides on FET transistors elsewhere in the circuit, depositing a layer of polysilicon and patterning it simultaneously with patterning of transistor gate electrodes to form upper electrode 55 of the varactor.

Sidewalls 57 are thermal oxide spacers using the same process to form spacers on transistors. Sidewalls 59 are nitride spacers formed by the standard process of depositing a layer of nitride over the gate electrode and using a directional etch to remove the horizontal portions on top of the gate and outside the gate. Advantageously, both these spacer processes are the same as those used in forming transistors and are performed simultaneously with the formation of spacers on transistors in the rest of the circuit. One of the spacers may be omitted if desired.

Figure 3A:
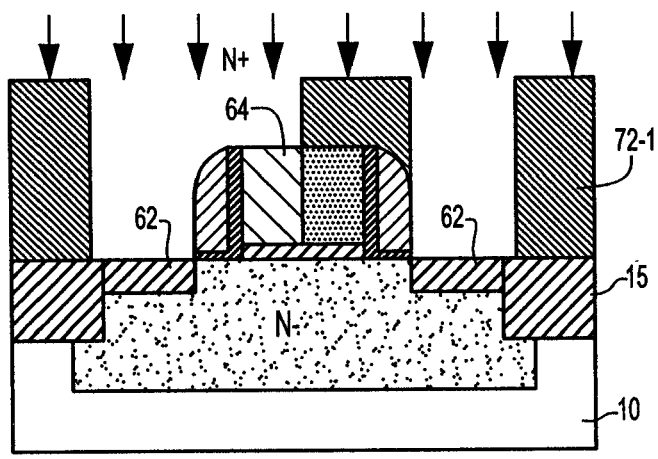
FIGS. 3A and 3B show alternative implant methods for the first polarity of the gate.

FIG. 3A shows the process of implanting electrodes to contact the lower capacitor electrode simultaneously with the implantation of part of the gate electrode.

An aperture is patterned and opened in resist 72-1 that exposes half of the gate electrode and a portion of the well outside the gate structure. An N+ implant dose, chosen as the same polarity as N-well 30, is implanted to form electrodes 62 for the lower electrode and a gate electrode 64. Advantageously, the implant dose is the same as that used to form source and drain electrodes in transistors, so that the same mask is used for the varactor electrodes as is used for the NFET source and drain.

Figure 4A:
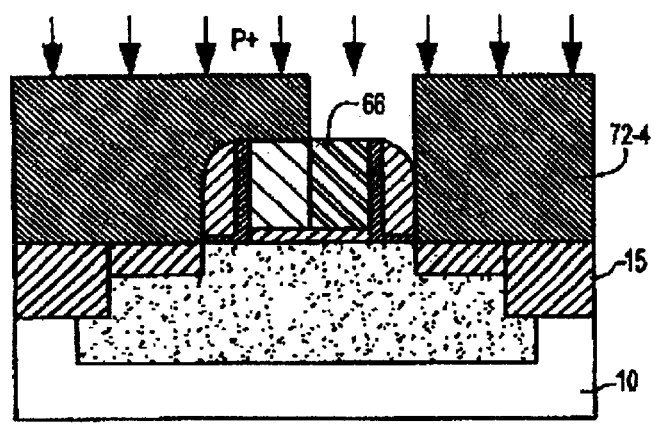
FIGS. 4A and 4B show alternative implants for the second polarity of the gate.

FIG. 4A show the implantation of the remaining portion of the gate electrode. Resist 72-4 has an aperture opened that covers the region 66 of the gate electrode to be implanted with the opposite polarity as electrodes 62 and 64 (P+). The right side of the aperture in the resist is non-critical because the implantation of part of the sidewalls does not matter.

Figure 3B:
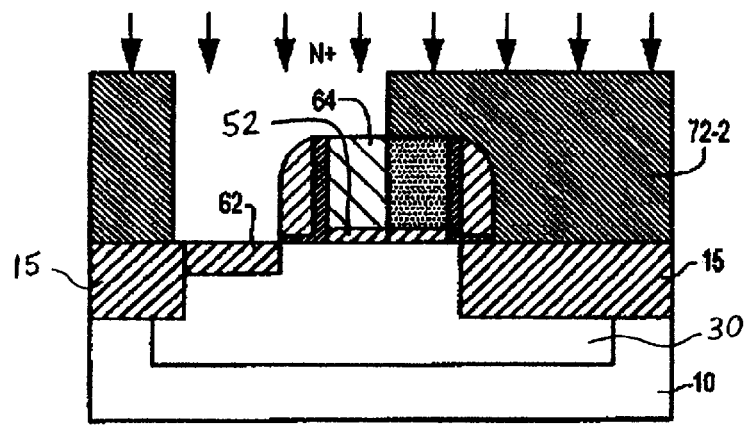

FIG. 3B shows an alternative approach to the implantation of the electrodes of the varactor. Resist 72-2 has a single aperture that covers only one side of the gate 64 and one electrode 62. The isolation insulator 15 extends up to the sidewalls in this figure, since there is only one electrode 62 connected to the lower varactor plate.

Figure 4B:
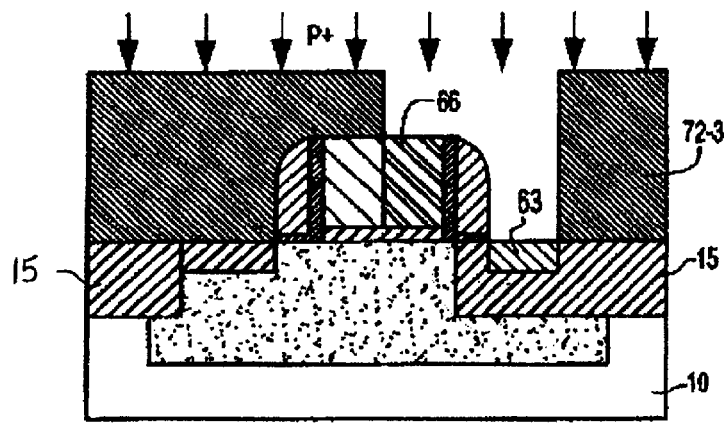

FIG. 4B shows the implantation of the P-type portion 66 of the gate electrode. The aperture in resist 72-3 is oversized to illustrate that it is non-critical, since implantation of the isolation dielectric 15 in area 63 does not matter.

Implementing an abutted p-n region in the polysilicon gate of a MOS varactor by using the standard PFET & NFET Source/Drain Implant avoids the need for extra masks and/or implant steps and provides an improved varactor that is "free" in the sense that an additional mask and/or additional implant is not required.

Varactors in the prior art implement two separate gates (one p-type and the other n-type ... etc), separated according to the groundrules used in that particular circuit, to obtain improved/increased tuning range and tuneability. This invention reduces the total area compared with previous methods and will improve usability of the MOS Varactor in voltage controlled oscillator (VCO) frequency tuning applications and other complex circuits.

Figure 5A:
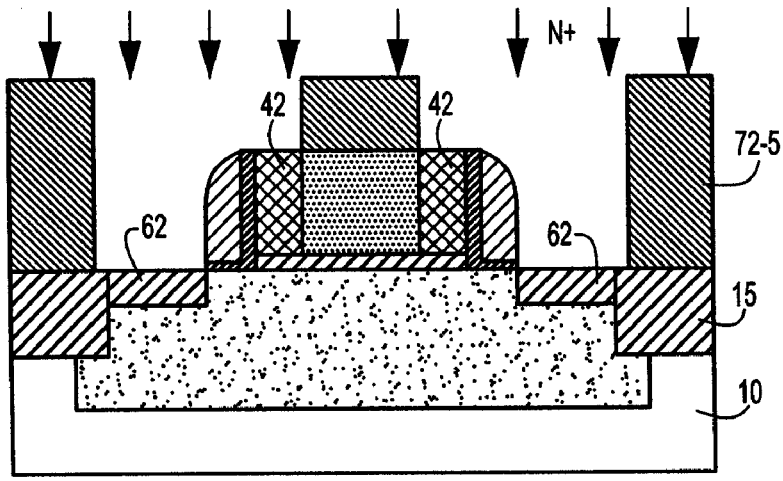
FIGS. 5A and 5B show an alternative structure of a three-segment gate.

FIG. 5A illustrates the same process steps as applied to a different configuration of the gate electrode. In this case, resist 72-5 has been patterned to expose one quarter of the gate electrode width on each side of electrode 42, to be implanted as before with the standard N+ source/drain dose simultaneously with contacts 62 for the lower capacitor plate.

Figure 5B:
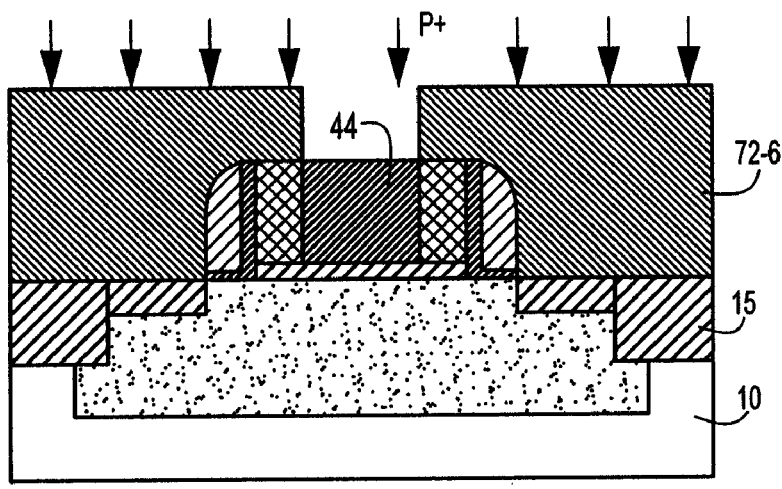

FIG. 5B shows the complementary implant in resist 72-6 of the remaining one half of the gate 44 with a P+ dose that is the same as used for PFET transistors in the circuit, thereby forming an N-P-N structure in the gate. Those skilled in the art will readily be able to extend the examples shown to a P-N-P-N structure, etc.

Figure 6:
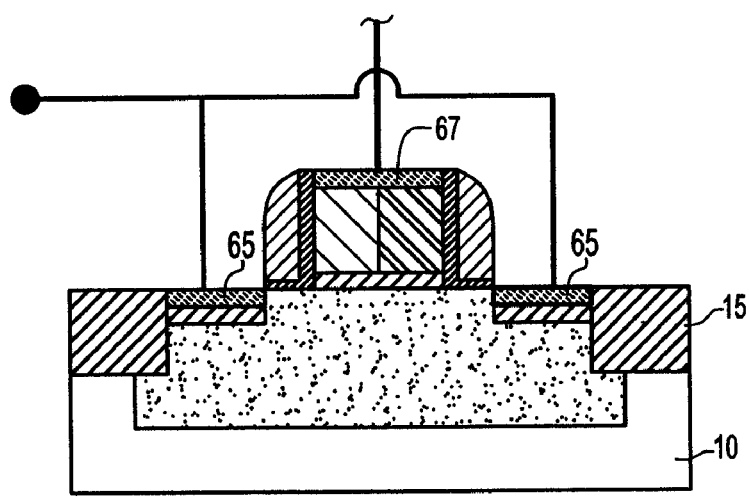
FIG. 6 shows a completed device.

FIG. 6 shows a completed varactor with the two halves of the gate shorted together by silicide 67. The same silicide covers the electrodes 65 of the lower capacitor plate. The silicide process is the same as that used for transistor electrodes in the remainder of the circuit.

The result of this fabrication process is a varactor that saves space as compared with previous methods of forming P-type and N-type varactors separately and connecting them in parallel. Simulations with the same ground rules have shown that a varactor according to the invention having the same amount of capacitance occupies about 35% less area.

The invention not only provides an area saving, it also produces a combined device having a larger tuning range. Previous p or n varactors had a C-V tuning range of 1.5 volts. Varactors constructed according to the present invention have an improved tuning range of 2.5 volts.

While the invention has been described in terms of a single preferred embodiment, those skilled in the art will recognize that the invention can be practiced in various versions within the spirit and scope of the following claims.

What is claimed is:

1. An MOS varactor comprising a gate electrode isolated from a lower electrode by an insulator layer, the gate electrode comprising a first region and a second region abutting the first region, in which said first region comprises a material of a first conductivity type and said second region comprises a material of a second conductivity type opposite the first conductivity type, wherein said gate electrode further includes a third region comprising a material of the first conductivity type formed adjacent to said second region, whereby said second region is bracketed by said first and third regions, wherein said lower electrode extends substantially between and to a depth greater than a depth of a pair of adjacent isolation insulators, said lower electrode overlaps respectively with each of the pair of adjacent isolation insulators, the gate electrode located substantially between the pair of adjacent isolation insulators, and said lower electrode comprises a contact located entirely within a portion of said lower electrode, said contact located between a first side of the gate electrode and a first of said pair of adjacent isolation insulators, and said contact located adjacent to said first region of the gate electrode, said contact comprising the material of the first conductivity type.

2. The MOS varactor of claim 1, wherein the lower electrode is formed in a well in a substrate.

3. The MOS varactor of claim 1, wherein a second of said pair of adjacent isolation insulators extends to a second side opposite said first side of the gate electrode so that said lower electrode is contact-free on the second side of the gate electrode.

4. The MOS varactor of claim 1, wherein said material of the first conductivity type comprises an ion implanted dopant.

5. The MOS varactor of claim 1, wherein said lower electrode comprises another contact between a second side opposite said first side of the gate electrode and a second of said pair of adjacent isolation insulators, said another contact located adjacent to said third region of the gate electrode, and said material of the first conductivity type formed simultaneously in said contact, said another contact, said first region and said third region.

6. The MOS varactor of claim 1 further comprising a conductor layer physically in contact with said first and second regions for electrically coupling said first and second regions in parallel.

7. The MOS varactor of claim 6, wherein the lower electrode is formed in a well in a substrate.

8. The MOS varactor of claim 6, wherein said conductor layer comprises silicide.

9. The MOS varactor of claim 8, wherein the lower electrode is formed in a well in a substrate.

* * * * *